United States Patent [19]
Dulong et al.

[11] Patent Number: 5,530,921
[45] Date of Patent: Jun. 25, 1996

[54] ENHANCED SYSTEM AND METHOD FOR IMPLEMENTING A BACKUP CONTROL CHANNEL IN A CELLULAR TELECOMMUNICATION NETWORK

[75] Inventors: Daniel Dulong, Pincourt; Richard Brunner, Montreal, both of Canada

[73] Assignee: Telefonaktiebolaget LM Ericsson, Stockholm, Sweden

[21] Appl. No.: 386,069

[22] Filed: Feb. 9, 1995

[51] Int. Cl.⁶ ............................ H01Q 11/12; H04B 17/00
[52] U.S. Cl. .......................... 455/120; 455/8; 455/103; 455/67.1; 333/132
[58] Field of Search .................. 455/8, 9, 17, 34.1, 455/53.1, 115, 120, 103, 67.1; 333/132; 371/8.1, 8.2, 11.1, 11.2; 375/224; 370/13

[56] References Cited

U.S. PATENT DOCUMENTS

| | | | |
|---|---|---|---|
| 4,039,947 | 8/1977 | Miedema | 455/8 |
| 4,829,554 | 5/1989 | Barnes et al. | 379/58 |
| 5,034,707 | 8/1991 | Kagstrom | 455/103 |
| 5,187,808 | 2/1993 | Thompson | 455/8 |
| 5,274,838 | 12/1993 | Childress et al. | 455/9 |
| 5,448,769 | 9/1995 | Jantti | 455/115 |
| 5,487,185 | 1/1996 | Halonen | 455/8 |

FOREIGN PATENT DOCUMENTS

WO95/08875  3/1995  WIPO.

OTHER PUBLICATIONS

Alex Hill and Chris radcliffe "The Design of a GSM base-station tuneable combiner" Microwave engineering Europe pp. 57–58, 61–62 and 65 Oct. 1992.

Primary Examiner—Andrew Faile
Assistant Examiner—Gertrude Arthur
Attorney, Agent, or Firm—Smith & Catlett

[57] ABSTRACT

A local control mechanism for automatically parking an active combiner filter and activating an alternate combiner filter in an auto-tune combiner in a radio telecommunications network is resident entirely at a remote base station. The mechanism samples the radio frequency (RF) energy level on the active combiner filter in an auto-tune combiner and determines whether the measured RF energy level exceeds a predetermined RF energy threshold. The mechanism then determines the number of RF energy samples taken, compares this number to a trigger number, and parks the active combiner filter and switches to an alternate combiner filter when the number of consecutive RF energy samples below the RF energy threshold exceeds the trigger number.

16 Claims, 4 Drawing Sheets

ENHANCED SYSTEM AND METHOD FOR IMPLEMENTING A BACKUP CONTROL CHANNEL IN A CELLULAR TELECOMMUNICATION NETWORK

BACKGROUND OF THE INVENTION

1. Technical Field of the Invention

The present invention relates to a cellular telecommunication network, and more particularly, to an improved system and method for implementing a backup to the network's control channel.

2. Description of Related Art

In modern cellular telecommunication networks, the networks are divided into cells which service a defined area for mobile stations. Each cell contains a base station which transmits and receives voice and control information to and from mobile stations (mobile phones) which are located within the cell's coverage area. Each of the cells employs a separate control channel for relaying control information to mobile stations, and voice channels for relaying voice information. Currently, cellular telecommunications networks utilize analog control channels for the passing of control information, however, digital technology has been introduced to solve many of the limitations and problems associated with analog technology. Therefore, the cellular telecommunication industry is rapidly moving toward finalizing a standard for a Digital Control Channel (DCCH) which has total frequency agility over the entire mobile telephone frequency spectrum. The current version of the cellular industry standard for a Digital Control Channel (DCCH) is described in Project No. 3011-2 of the EIA/TIA Interim Standard IS-54-C, "Cellular System Dual-Mode Mobile Station—Base Station Compatibility Standard", dated Apr. 8, 1994, which is hereby incorporated by reference herein.

The control channel, whether analog or digital, performs the function of providing access for mobile subscribers to services provided by cells within a cellular telecommunications network. Thus, if a control channel fails, the subscribers cannot access and utilize the services provided by the cell, resulting in unsatisfied customers and decreased revenues for the network operator.

In cellular telecommunication networks, mobile calls must be processed on a continuous basis. Therefore, it is critical to have base stations operating on a continuous basis. If a control channel is implemented on a base station's transmitter, and that transmitter subsequently fails, then all mobile stations within the base station's cell are no longer able to establish new communications with the base station. Therefore, it is desirable for base stations to have a backup control channel to ensure that a high service level is maintained in the associated cell.

In existing cellular base stations and two-way trunking systems where there are multiple transmitters, a common transmit antenna may be shared among a group of radios. Proper Radio Frequency (RF) devices are required in order to couple more than one transmitter to a single antenna. RF combiners are a typical example of such a coupling device.

In low power applications (i.e. in the range of a few watts or less), hybrid type combiner technology is often used. However, for higher power (in the range of 10's to 100's of watts or more), combiner systems with combiner filters are used. Combiner filters are frequency sensitive and require tuning, performed either manually or automatically. When the tuning is performed automatically, the combiner is known as an auto-tune combiner (ATC).

A minimum frequency spacing between active channels must be implemented to ensure sufficient RF isolation, impedance matching, and good return loss (reflected RF energy) in an ATC combiner system. Proper RF isolation will not be maintained if two combiner filters are tuned to the same frequency within the combiner system.

In existing analog cellular radio systems such as the Advanced Mobile Phone Service (AMPS) in the United States, and the Total Access Communication System (TACS) in some European and Asian countries, control channels use dedicated channel numbers representing frequency pairs. When a cell experiences a control channel failure, a backup control channel operating on the same channel number normally takes over. This backup or redundant control channel may be implemented with an available voice channel transceiver in the cell. The voice channel is made available, re-configured as a control channel, and re-tuned to the correct channel number.

When manually tuned combiners are used in the cell, a coaxial switch is often used to connect the backup control channel to the combiner input of the failed control channel. The freed combiner input is then terminated. This ensures that the RF combiner system maintains its RF characteristics. The coaxial switch must be operated automatically and must have the proper interface (electrical signal) and software support.

When auto-tune combiners (ATCs) are used, no coaxial switch is needed. However, the combiner filter associated with the failed control channel must be parked. The term "parked" means re-tuned to an unused frequency so that RF isolation and other previously mentioned desirable RF characteristics are maintained. Two combiner filters tuned to the same frequency may cause impedance mismatch and/or excessive return loss. Excessive return loss (reflected RF energy) can result in permanent damage to the radio transmitter. There is currently no system or method for automatically parking the combiner filter associated with the failed control channel.

Although there are no known prior art teachings of a solution to the aforementioned deficiency and shortcoming such as that disclosed herein, a number of prior art references exist that discuss subject matter that bears some relation to matters discussed herein. Such prior art references are U.S. Pat. No. 4,829,554 to Barnes et al., and U.S. Pat. No. 5,175,866 to Childress et al. Each of these references is discussed briefly below.

U.S. Pat. No. 4,829,554 to Barnes et al. utilizes radio interface modules (RIMs) at the cell base station to separately control each communications channel at the local (base station) level. Each RIM unit independently sets up the radio portion of the link between the base station and the mobile station, and maintains and monitors the link including both communications and control signals. Barnes does not, however, teach or suggest any system or method of automatically parking ATC combiner filters in order to maintain adequate RF isolation when the backup control channel operates on the same channel number.

U.S. Pat. No. 5,175,866 to Childress et al. is a digitally trunked fail-soft architecture for a public telecommunications system. A trunking card is assigned to the control channel where it independently processes RF signals being transmitted and received by an associated repeater. During each inbound control channel slot (a time interval during which a mobile station transmits its working channel acquisition request), the trunking card determines whether or not a message is being received. If a message is being received, it is processed. If no message is received, the trunking card polls the other trunking cards in the system for status information. Although Childress permits rapid detection of control channel failure, and subsequent identification of normally operating channels, Childress does not teach or suggest any system or method of automatically parking ATC combiner filters in order to maintain adequate RF isolation when the backup control channel operates on the same channel number.

Review of each of the foregoing references, therefore, reveals no disclosure or suggestion of a system or method such as that described and claimed herein.

It would be a distinct advantage to have a system and method of automatically parking the combiner filter associated with the failed control channel in order to overcome these disadvantages. The present invention provides such a solution.

SUMMARY OF THE INVENTION

In one aspect, the present invention is a local control mechanism for automatically parking an active combiner filter and activating an alternate combiner filter in an auto-tune combiner in a radio telecommunications network. The mechanism is resident entirely at a remote base station and comprises means for sampling the radio frequency (RF) energy level on the active combiner filter, and means for determining whether the sampled RF energy level exceeds a predetermined RF energy threshold. The mechanism also includes means for determining the number of RF energy samples taken, means for comparing this number to a trigger number, and means for parking the active combiner filter and activating the alternate combiner filter when the number of consecutive RF energy samples below the RF energy threshold exceeds the trigger number.

In another aspect, the present invention is a method of automatically parking an active combiner filter and activating an alternate combiner filter in an auto-tune combiner in a radio telecommunications network. The method is performed entirely at a remote base station and comprises the steps of sampling the radio frequency (RF) energy level on the active combiner filter and determining whether the sampled RF energy level exceeds a predetermined RF energy threshold. The method then determines the number of RF energy samples taken, compares this number to a trigger number, and parks the active combiner filter and activates the alternate combiner filter when the number of consecutive RF energy samples below the RF energy threshold exceeds the trigger number.

BRIEF DESCRIPTION OF THE DRAWINGS

The invention will be better understood and its numerous objects and advantages will become more apparent to those skilled in the art by reference to the following drawings, in conjunction with the accompanying specification, in which.

DETAILED DESCRIPTION OF EMBODIMENTS

Figure 1:
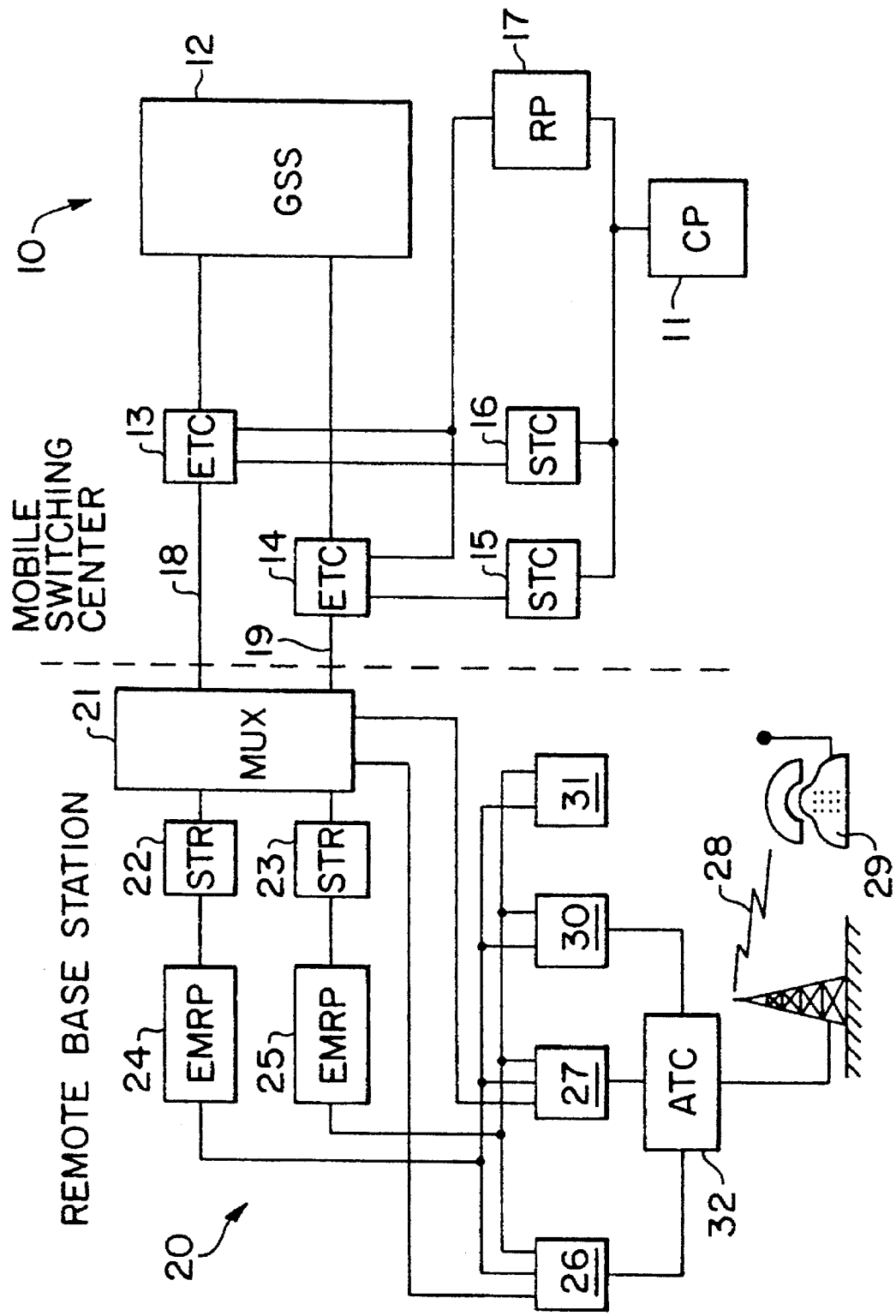
FIG. 1 is a block diagram of a portion of a mobile telephone network including a mobile switching center (MSC) and a remote base station which is suitable for implementing the preferred embodiment of the present invention.

Referring now to FIG. 1, there is shown a block diagram of a portion of a mobile telephone network including a mobile switching center (MSC) 10 and a remote base station 20 which is suitable for implementing the preferred embodiment of the present invention. It should be understood that this configuration of a MSC and a remote base station is shown by way of example only, and other MSC and base station configurations may also be utilized with the present invention. The MSC 10 includes a central processor 11, a group switching subsystem 12, exchange terminal circuits 13 and 14, and signalling terminals (central) 15 and 16. The MSC may also include a regional processor 17. Communications links 18 and 19 connect the MSC 10 to the remote base station 20. The signalling terminals (central) 15 and 16 are provided in the MSC 10 to connect the central processor 11 to each of the exchange terminal circuits 13 and 14. One signalling terminal (central) is provided for each communications link 18 and 19 extending between the MSC 10 and the remote base station 20 that is to be used by the network for common channel carrying of processor signalling message communications. The signalling terminals (central) 15 and 16 process and format processor signalling messages output from the central processor 11 into the proper format for transmission over the communications links 18 and 19. The exchange terminal circuits 13 and 14 then insert the formatted messages through time division multiplexing into the communications links 18 and 19 for transmission to the remote base station 20.

In the remote base station 20, the communications links 18 and 19 with the MSC 10 are connected to a multiplexer 21. The processor signalling messages carried on the communications links 18 and 19 for the common channel signalling system are then connected to signalling terminals (remote) 22 and 23 which are further connected to extension module regional processors 24 and 25. The multiplexer 21 extracts the formatted processor signalling messages from the communications links 18 and 19, and the connected signalling terminals (remote) 22 and 23 process and reformat the processor signalling messages for output to the extension module regional processors 24 and 25.

The subscriber communications carried on the communications links 18 and 19, on the other hand, are connected from the multiplexer 21 to a plurality of voice channel circuits 26 and 27 for facilitating subscriber communications over a wireless communications link 28 using mobile telephones 29. The extension module regional processors 24 and 25 are also connected to the voice channel circuits 26 and 27, and are further connected to a control channel circuit 30 for facilitating the use of well known control message communications over the wireless link 28 between the base station 20 and the mobile telephones 29. A signal strength circuit 31, also connected to the extension module regional processors 24 and 25, is provided for monitoring the signal strength of the communications effectuated over the wireless link 28 between the base station 20 and the mobile telephones 29.

The voice channel circuits 26 and 27, and the control channel circuit 30, are connected to a transmitter/receiver and filter which may be, for example, an auto-tune combiner (ATC) 32.

Figure 2:
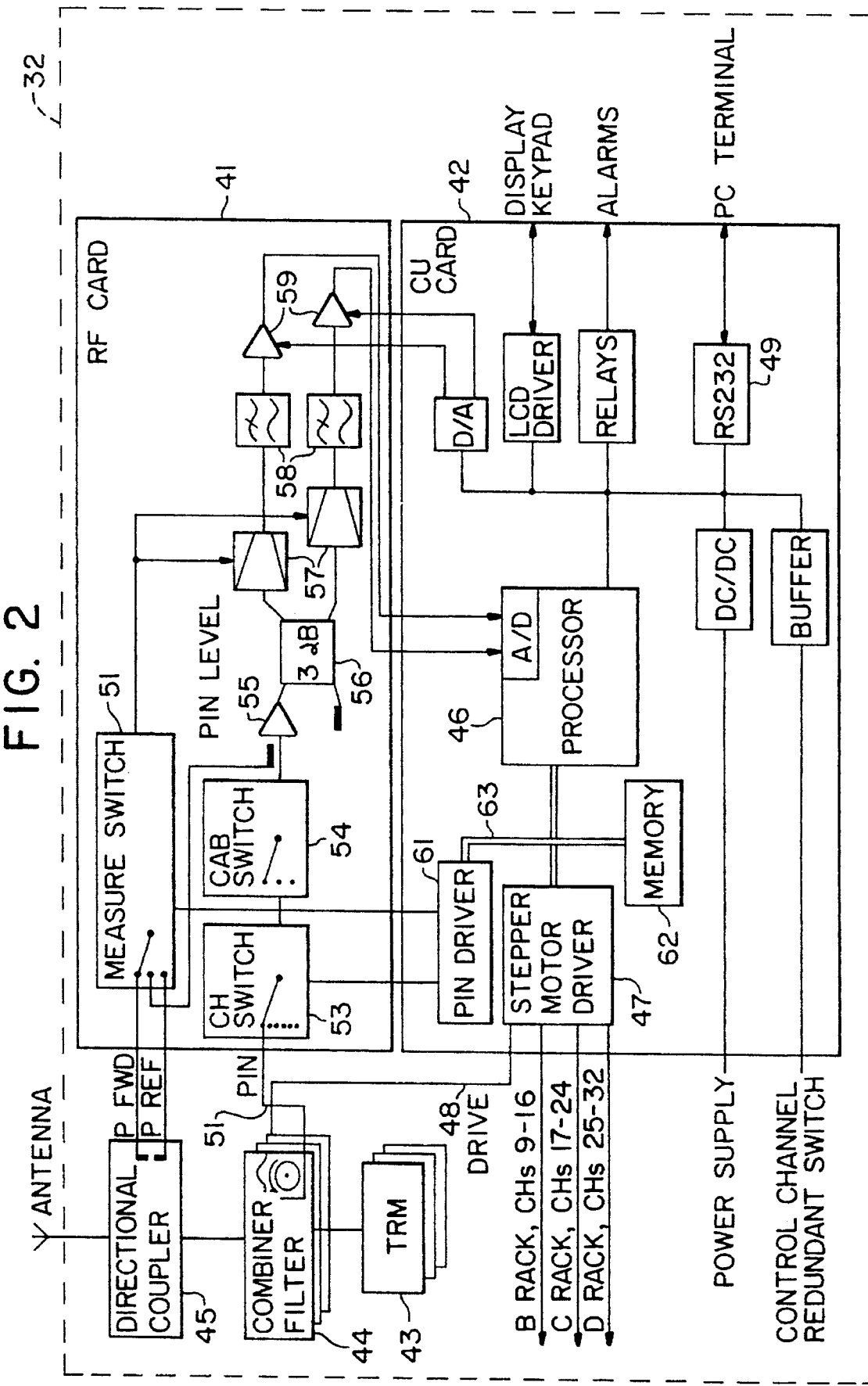
FIG. 2 is a block diagram of an auto-tune combiner suitable for implementing the present invention.

FIG. 2 is a block diagram of an auto-tune combiner (ATC) 32 suitable for implementing the present invention. The ATC 32 may comprise a radio frequency (RF) card 41, a control unit (CU) card 42, at least one transmitter module 43, at least one combiner filter 44, and a directional coupler 45. A processor 46 on the CU card 42 controls the functions of the ATC 32 and also controls the parking switchover functions for the combiner filters. The processor 46 controls the parking switchover functions through a stepper motor driver 47 which sends a drive signal 48 to a stepper motor (not shown) which switches the combiner filters 44. The processor 46 is also connected to a standard RS232 interface 49. The RS232 interface 49 may be utilized on site by a setup crew to program the processor 46 with information regarding the primary and alternate combiner filters 44.

The RF card 41 includes a measure switch 51 which may be utilized to switch between measurements of forward power and reflected power coming from the directional coupler 45. A power-in (PIN) signal 52 indicates the RF energy level in the active combiner filter 44. The PIN signal 52 is routed through a channel switch 53 and a cabinet switch 54 to a comparator 55 where it is compared with the forward power or reflected power signal from the measure switch 51. The compared PIN signal 52 then passes through a 3-dB splitter 56, amplifiers 57, low pass filters 58, and comparators 59 to reach the processor 46. The processor 46 controls the measure switch 51 and the channel switch 53 through a PIN driver 61. The stepper motor driver 47, PIN dirver 61, and a memory 62 are all connected to the processor 46 via a data bus 63.

Figure 3:
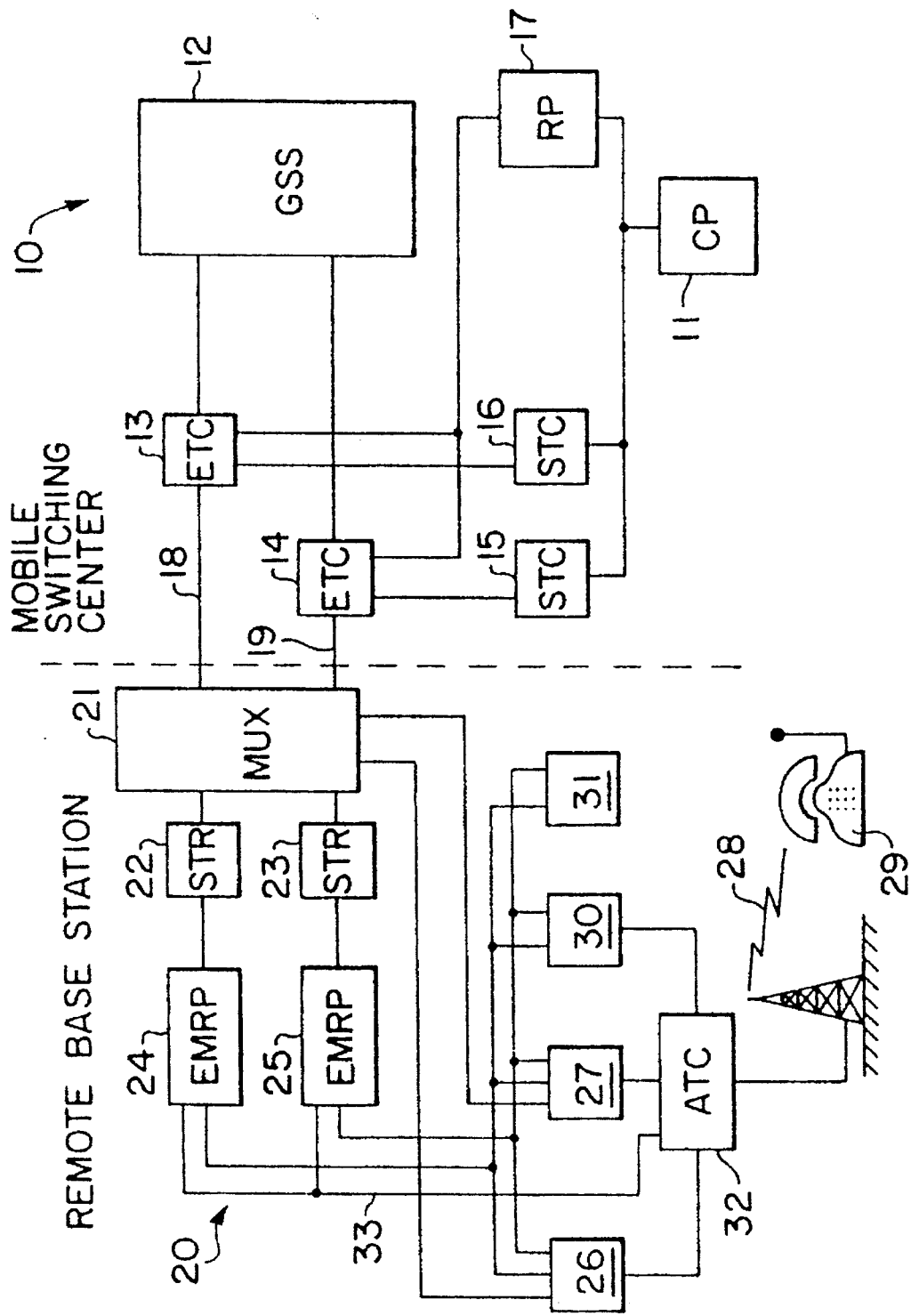
FIG. 3 is a block diagram of a portion of a mobile telephone network including a mobile switching center (MSC) and a remote base station in which the auto-tune combiner is integrated with the remote base station in an alternative embodiment of the present invention.

FIG. 3 is a block diagram of a portion of a mobile telephone network including a mobile switching center (MSC) and a remote base station in which the auto-tune combiner (ATC) is integrated with the remote base station in an alternative embodiment of the present invention. An electrical interface 33 is added to the configuration of FIG. 1 between the ATC 32 and the extension module regional processors 24 and 25. The electrical interface 33 allows for remote access to the ATC 32 from the MSC 10. Thus, the ATC processor 46 may be remotely programmed with the primary and alternate combiner filters 44, thereby eliminating the requirement for setup crews to travel to each remote base station for this purpose.

Figure 4:
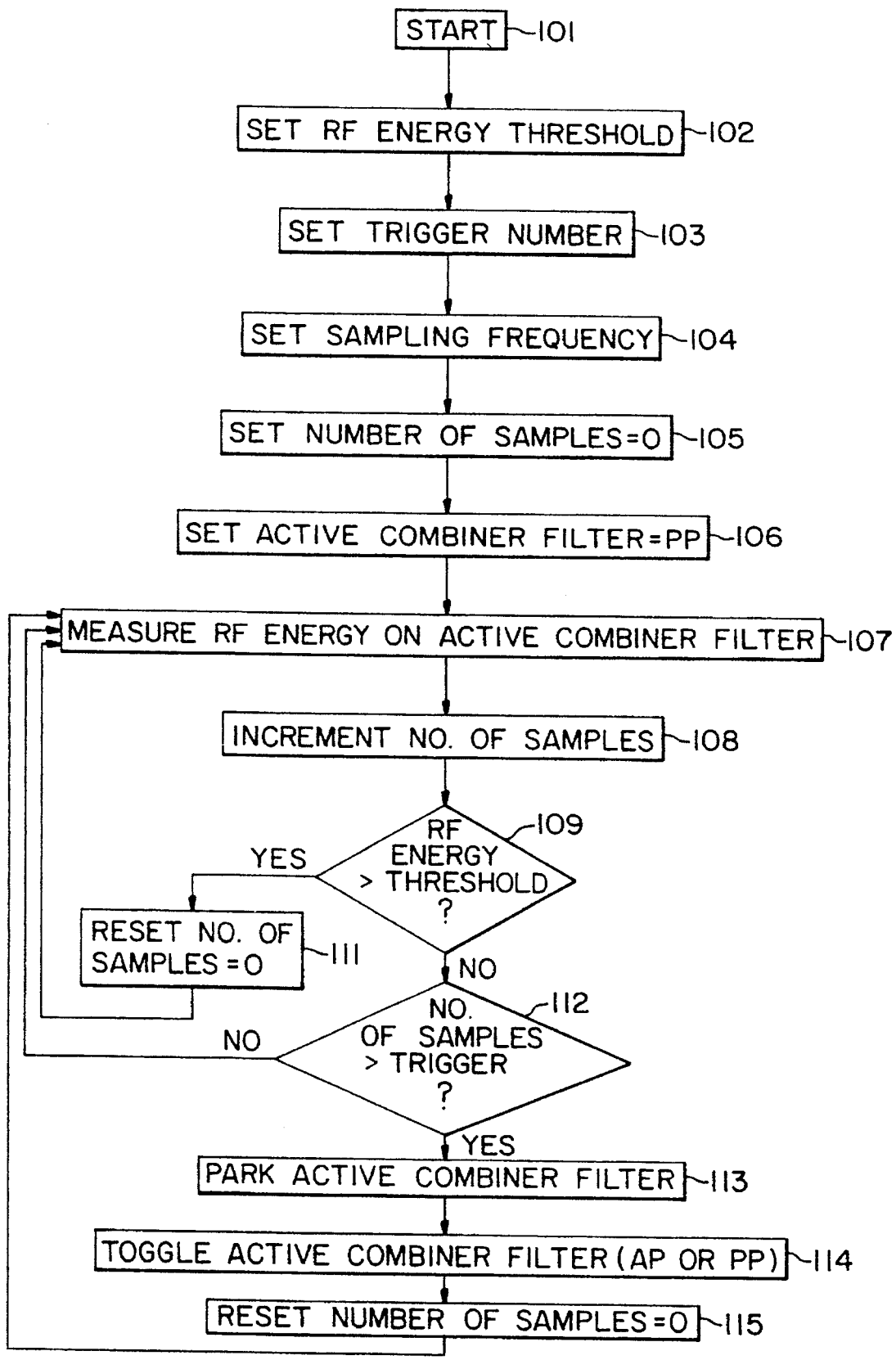
FIG. 4 is a flow chart illustrating the functions performed when detecting a failure of a combiner filter, parking the failed combiner filter, and bringing a backup combiner filter on line according to the teachings of the present invention.

FIG. 4 is a flow chart illustrating the functions performed when detecting a failed combiner filter 44 within the ATC 32, parking the failed combiner filter, and bringing a backup combiner filter on line according to the teachings of the present invention. The goal is to avoid having two combiner filters tuned to the same frequency within an ATC system. The parking function may be implemented utilizing the processor 46 in the ATC 32, and may be controlled via a software control program or logic circuitry.

A suitable software control program starts at step 101 and then moves to step 102 where a threshold level of RF energy in the active combiner filter is established. This threshold may be, for example, 0 dBm, although other thresholds may be established, depending on operational considerations. The program then moves to step 103 where a trigger is set. The trigger is the number of RF samples, measured at or below the threshold RF level, that are required to trigger the parking function of the present invention. The trigger may be set, for example, at 5 samples, depending on operational considerations. At step 104, the program sets the frequency at which the ATC 32 is directed to take RF samples in the active combiner filter. The frequency may be set, for example, at one sample every 0.1 seconds, but as with the threshold and trigger, may vary depending on operational considerations. The trigger number and sampling frequency may be adjusted to preclude, for example, false indications of combiner filter failure when the samples are too few or the sampling frequency is too fast.

It is important to note that the control mechanism of the present invention may be implemented entirely at the remote base station 20, and does not require any special software at the associated mobile switching center (MSC) 10 or any signaling between the remote base station 20 and the MSC 10. However, this local control aspect of the present invention must be compatible with control functions which are implemented at the MSC 10. One such function is the initiation of a backup control channel when the MSC detects a control channel failure. This places a constraint on the trigger number and the sampling frequency in that the total time to take the trigger number of samples cannot exceed the time frame in which the MSC 10 would take over and initiate a backup control channel. Otherwise, two combiner filters could be parked on the same frequency, causing impedance mismatch and/or excessive return loss and possible damage to the ATC's radio transmitter modules 43. Generally, the time frame required for the MSC 10 to detect a control channel failure and initiate a backup is in the range of 15–30 seconds. Thus, the recommended settings of a trigger number of 5 samples and a sampling frequency of 0.1 seconds ensure that the local mechanism of the present invention completes the parking and switching functions well before the MSC 10 detects a control channel failure.

Still referring to FIG. 4, at step 105 the program initializes the system by setting to zero (0) the number of RF samples taken. The active combiner filter is then set to the ATC's primary port (PP) at 106. At step 107, the ATC 32 is directed to sample the radio frequency (RF) energy in the active combiner filter 44. The program then moves to step 108 where the number of samples taken is incremented by one (1). The program then moves to step 109 where it is determined whether or not the RF energy in the active combiner filter exceeds the threshold. If the RF energy exceeds the threshold, then the active combiner filter is producing a sufficient amount of RF energy for the operation of the control channel. The program then moves to step 111 where the number of samples taken is reset to zero (0). The program then returns to step 107 and continues to sample the RF energy in the active combiner filter of the ATC 32.

If, however, at step 109 it is determined that the RF energy in the active combiner filter does not exceed the threshold, the program moves to step 112 where the number of samples taken is compared to the trigger number to determine whether or not the number of sequential samples below the threshold has exceeded the trigger number. If the number of samples does not exceed the trigger number, the program returns to step 107 and takes another sample of the RF energy in the active combiner filter.

If, however, it is determined at step 112 that the number of samples below the threshold exceeds the trigger number, then the program proceeds to step 113 where the program directs the ATC 32 to park the active combiner filter. At step 114, the program toggles the active combiner filter. If the ATC was monitoring the primary combiner filter, then the active combiner filter is switched to an alternate port (AP). If the ATC was monitoring an alternate combiner filter, then the active combiner filter is switched to the primary port (PP). At step 115, the number of samples is reset to zero (0), and the program returns to step 107 where it continues to sample RF energy in the new active combiner filter.

It is thus believed that the operation and construction of the present invention will be apparent from the foregoing description. While the method, apparatus and system shown and described has been characterized as being preferred, it will be readily apparent that various changes and modifications could be made therein without departing from the spirit and scope of the invention as defined in the following claims.

What is claimed is:

1. A local control mechanism for automatically parking an active combiner filter and activating an alternate combiner filter in an auto-tune combiner in a radio telecommunications network, said mechanism resident entirely at a remote base station and comprising:

means for sampling the radio frequency (RF) energy level on the active combiner filter;

means for determining whether said sampled RF energy level exceeds a predetermined RF energy threshold;

means for determining the number of RF energy samples taken; and means for parking said active combiner filter and activating said alternate combiner filter.

2. The local control mechanism for automatically parking a combiner filter of claim 1 further comprising means for varying said predetermined RF energy threshold.

3. The local control mechanism for automatically parking a combiner filter of claim 2 further comprising means for setting a trigger number of RF energy samples.

4. The local control mechanism for automatically parking a combiner filter of claim 3 further comprising means for determining whether the number of consecutive RF energy samples below the predetermined RF energy threshold exceeds said trigger number, said control mechanism parking said active combiner filter when the number of consecutive RF energy samples below the predetermined RF energy threshold exceeds said trigger number.

5. The local control mechanism for automatically parking a combiner filter of claim 4 further comprising means for resetting said number of samples taken to zero.

6. The local control mechanism for automatically parking a combiner filter of claim 5 further comprising means for setting a sampling frequency.

7. The local control mechanism for automatically parking a combiner filter of claim 6 further comprising means for locally designating a primary combiner filter to be said active combiner filter, and an alternate combiner filter.

8. The local control mechanism for automatically parking a combiner filter of claim 6 further comprising means for remotely designating a primary combiner filter to be said active combiner filter, and an alternate combiner filter.

9. A method of automatically parking an active combiner filter and activating an alternate combiner filter in an auto-tune combiner in a radio telecommunications network, said method being performed entirely at a remote base station and comprising the steps of:

sampling the radio frequency (RF) energy level on the active combiner filter;

determining whether said sampled RF energy level exceeds a predetermined RF energy threshold;

determining the number of RF energy samples taken; and parking said active combiner filter and activating said alternate combiner filter.

10. The method of automatically parking a combiner filter of claim 9 further comprising the step of varying said predetermined RF energy threshold.

11. The method of automatically parking a combiner filter of claim 10 further comprising the step of setting a trigger number of RF energy samples.

12. The method of automatically parking a combiner filter of claim 11 further comprising the step of determining whether the number of consecutive RF energy samples below the predetermined RF energy threshold exceeds said trigger number, said active combiner filter being parked when the number of consecutive RF energy samples below the RF energy threshold exceeds said trigger number.

13. The method of automatically parking a combiner filter of claim 12 further comprising the step of resetting said number of samples taken to zero.

14. The method of automatically parking a combiner filter of claim 13 further comprising the step of setting a sampling frequency.

15. The method of automatically parking a combiner filter of claim 14 further comprising the step of locally designating a primary combiner filter to be said active combiner filter, and an alternate combiner filter.

16. The method of automatically parking a combiner filter of claim 14 further comprising the step of remotely designating a primary combiner filter to be said active combiner filter, and an alternate combiner filter.

* * * * *